United States Patent [19]

Izu et al.

[11] Patent Number: 5,274,346
[45] Date of Patent: Dec. 28, 1993

[54] INTEGRATED LC FILTER

[75] Inventors: Toshio Izu; Kazuo Sato; Shigeyuki Doi; Hisashi Osada, all of Tokyo, Japan

[73] Assignee: TDK Corporation, Tokyo, Japan

[21] Appl. No.: 934,171

[22] Filed: Aug. 21, 1992

[30] Foreign Application Priority Data

Aug. 22, 1991 [JP] Japan .................................. 3-235580

[51] Int. Cl.⁵ .......................................... H03H 7/075
[52] U.S. Cl. ..................................... 333/184; 333/185
[58] Field of Search ................ 333/140, 181, 184, 185, 333/175, 176, 167; 336/205

[56] References Cited

U.S. PATENT DOCUMENTS

| | | | |
|---|---|---|---|
| 3,721,747 | 3/1973 | Renskers | 333/185 |
| 3,755,762 | 8/1973 | Boulin et al. | 333/185 |
| 4,516,092 | 5/1985 | Rosenberg | 333/185 X |
| 4,818,960 | 4/1989 | Satoh et al. | 333/185 |

FOREIGN PATENT DOCUMENTS

| | | |
|---|---|---|
| 56-8175 | 2/1981 | Japan . |
| 59-161010 | 9/1984 | Japan . |
| 62-80318 | 5/1987 | Japan . |
| 3-38620 | 4/1991 | Japan . |
| 3-125520 | 12/1991 | Japan . |

Primary Examiner—Robert J. Pascal
Assistant Examiner—Seung Ham
Attorney, Agent, or Firm—Thomas R. Morrison

[57] ABSTRACT

A case has parts storage openings through a top plane. Terminals protrude above the plane and extend downward through the case to a bottom plane, where they are bent to conform to the bottom plane. Interconnections of the terminals in the bottom plane provide the wiring pattern necessary for the creation of an LC filter. LC combination parts are made using a coil wound on a coil support with a capacitor secured to the top surface of the coil support. The coil part of the LC combination parts are inserted into the parts storage openings of the case, to secure the coils rigidly in place. The coils and capacitors are affixed to the terminals above the top plane. The resulting rigid support of the LC combination units provides stable and accurate filter characteristic in a compact package. The interconnections of the terminals in the bottom plane permits observation of the connections to permit manual inspection or the use of pattern recognition hardware and software for robotic sorting and assembly.

8 Claims, 4 Drawing Sheets

INTEGRATED LC FILTER

BACKGROUND OF THE INVENTION

The present invention relates to LC filters and, more particularly, to LC filters having a plurality of LC stages and a storage chamber, whereby it is possible to achieve stable and accurate filter characteristics, in a compact package which permits direct observation of the wiring from external to the package, and which is amenable to mass production.

An LC filter of the prior art includes an inductor and a capacitor as discrete components attached to a base. Alternatively, the capacitor is formed on the dielectric base as an electrode which is then coated with an insulating paint. The coil is attached to the capacitor. This procedure is disclosed in Japanese Laid Open Patent Publication No. 58-15223.

It is difficult to control the shape of the coating of insulating paint. When the core of the inductor of the LC filter is formed by painting magnetic and insulating materials on a substrate, the characteristic of the core may be changed by the process of painting and by the solids content of the paint being applied.

The above prior art presents certain problems. Besides the large area on the substrate, the direct attachment of the inductor and capacitor to the substrate complicates making the necessary circuit connections to these elements.

A further problem is that the filter characteristics are sensitive to the positions of the inductors and the directions of their axes. This is due at least partly to electromagnetic coupling between the inductors. Slight angular variation of the axes of the inductors produces substantial variation in the filter characteristics. In the prior art, electromagnetic coupling is reduced by increasing the spacing between inductors. In modern circuits, compact filters are desired. Compact filters require small spacing between inductors. Thus, if the position of an inductor is changed a small amount, either in distance or angle, or both, the filter characteristic may vary too much to be measured.

OBJECT AND SUMMARY OF THE INVENTION

It is an object of the present invention to provide an LC filter which overcomes the drawbacks of the prior art.

It is a further object of the present invention to provide an LC filter having stable filter characteristic which is easy to install and occupies a small volume.

It is a still further object of the present invention to provide an LC filter that permits direct inspection of inside wiring, and is easy to mass produce.

To achieve the above object, the LC filter of the present invention has a case and a plurality of LC combination parts. The case has a plurality of parts storage openings at one side of the case and a plurality of terminals adjacent the openings. The inductor of each of the LC combination parts is inserted into the parts storage opening, whereby the location of the inductor, and the angular direction of its axis is fixed by the parts storage opening. This avoids characteristic changes that can occur due to changes in the location and the axis direction of the inductor.

The LC filter of the present invention is easy to assemble since assembly merely requires insertion of the inductor LC combination parts into the parts storage openings of the case. In addition, since the overall shape of the assembled LC filter is fixed by the shape of the case, the LC filter of the present invention has a correspondingly high shape accuracy.

Since the terminals are made by bending bottom over the case, the wiring pattern is visible from outside the LC filter. The ability to see the wiring pattern directly reduces assembly errors. External visibility of the wiring pattern also enables use of a TV camera and pattern recognition software to discriminate, sort parts automatically and guide robotic assembly of LC filters. Since the terminals share the same plane as the bottom of the case, improved stability of attachment is possible.

Each of the LC combination parts has an inductor constructed by winding a coil on a coil support and attaching a capacitor to the coil support. Therefore, the combined coil and capacitor (the LC combination part) can be handled independently as a subassembly to simplify the fabrication of a specific circuit structure.

Briefly stated, the present invention provides an LC filter in which a case has parts storage openings through a top plane. Terminals protrude above the plane and extend downward through the case to a bottom plane, where they are bent to conform to the bottom plane. Interconnections of the terminals in the bottom plane provide the wiring pattern necessary for the creation of an LC filter. LC combination parts are made using a coil wound on a coil support with a capacitor secured to the top surface of the coil support. The coil part of the LC combination parts are inserted into the parts storage openings of the case, to secure the coils rigidly in place. The coils and capacitors are affixed to the terminals above the top plane. The resulting rigid support of the LC combination units provides stable and accurate filter characteristic in a compact package. The interconnections of the terminals in the bottom plane permits observation of the connections to permit manual inspection or the use of pattern recognition hardware and software for robotic sorting and assembly.

According to an embodiment of the invention, there is provided an LC filter comprising: a case, a plurality of LC combination parts, the case having a plurality of holes and a plurality of terminals, the holes forming openings through a first plane of the case, the terminals corresponding to each of the holes, the terminals extending from a position protruding above the plane to a position adjacent an opposite plane OF the case, the terminals each including a bend to place a portion thereof parallel to the opposite plane, the terminals forming a wiring pattern at the opposite plane, the LC combination parts including at least one inductor and at least one capacitor, the inductor of each of the LC combination parts being inserted through one of the holes through the first plane, means for electrically connecting the LC combination parts with the terminals protruding above the first plane, the inductor including a coil wound on a coil support, and the capacitors each being attached on a coil support.

According to a feature of the invention, there is provided an LC filter comprising: a case, at least one hole in the case, a first terminal group having at least first and second terminals in a line in the case on a first side of the at least one hole, a second terminal group having at least third and fourth terminals in a line in the case on a second side of the at least one hole, wiring interconnecting selected ones of the at least first and second terminals, and wiring interconnecting selected ones of the at least third and fourth terminals, an inductor, the inductor including a coil wound on a coil support, the coil support having first and second ends, at least first and second metal contacts affixed in the first end and extending upward therefrom, at least one capacitor, means for affixing the at least one capacitor to the at least first and second metal contacts, whereby the inductor and the at least one capacitor become an integral unit forming an LC combination unit, the at least one inductor being fitted into the at least one hole, and means for securing the LC combination unit in the case.

The above, and other objects, features and advantages of the present invention will become apparent from the following description in conjunction with the accompanying drawings, in which like reference numerals designate the same elements.

DETAILED DESCRIPTION OF THE PREFERRED EMBODIMENTS

Figure 1:
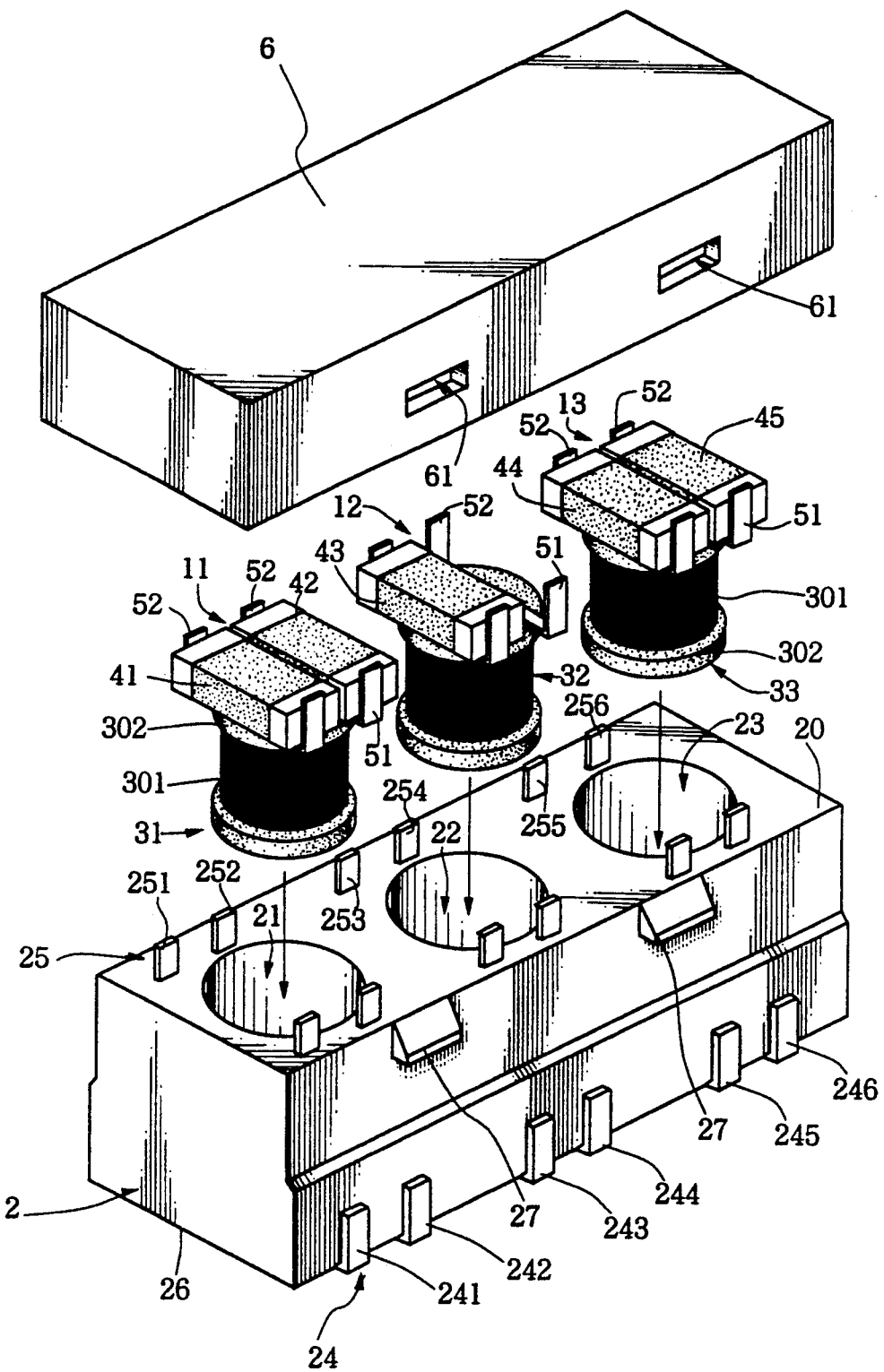
FIG. 1 is an exploded perspective view showing an embodiment of an LC filter according to an embodiment of the present invention.
Figure 2:
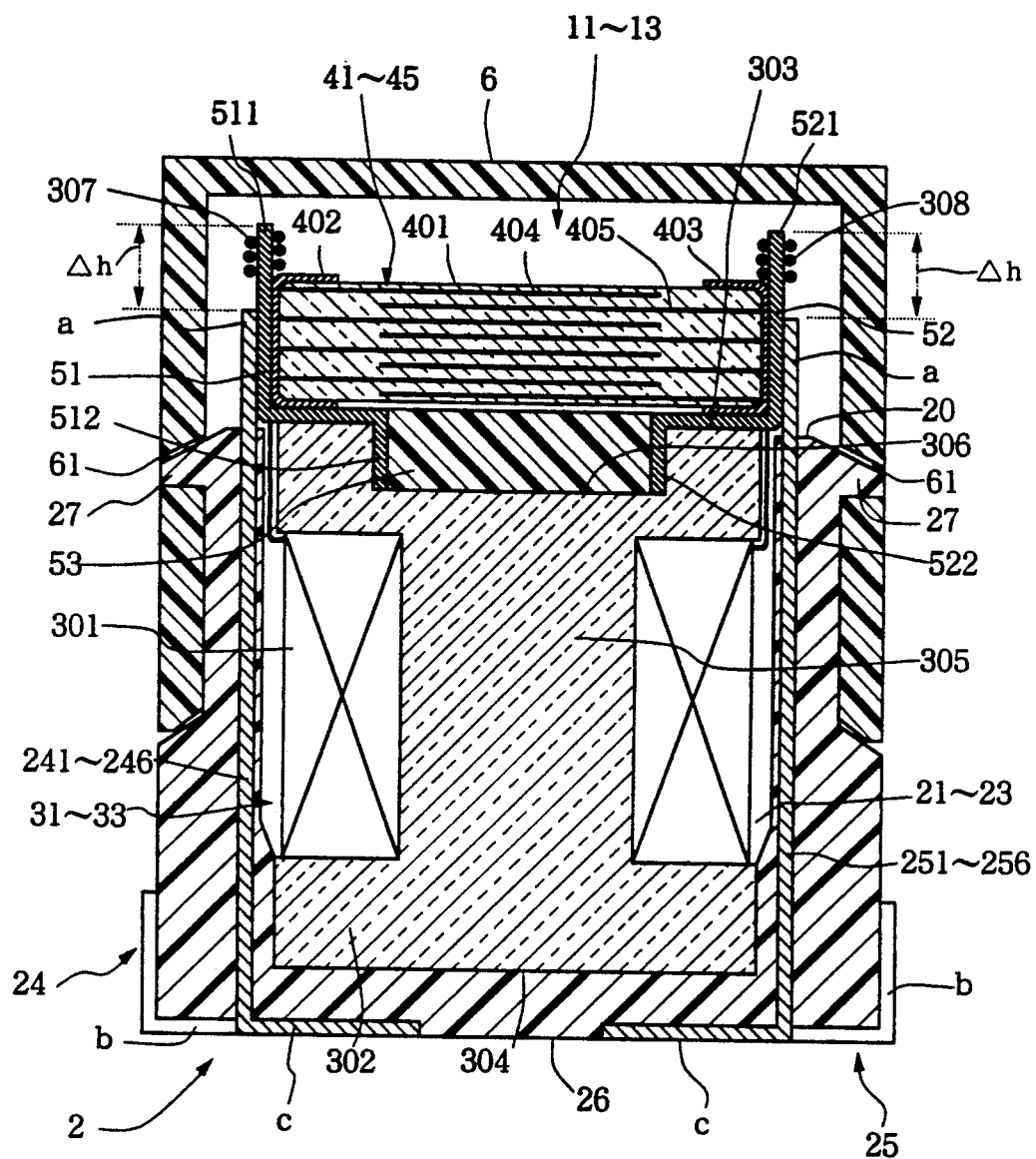
FIG. 2 is an expanded sectional view of FIG. 1.

Referring to FIGS. 1 and 2, a case 2 has a plurality of openings 21 to 23 penetrating downward through a top plane 20 thereof. A plurality of terminals 241 to 246 and 251 to 256 are disposed adjacent to openings 21 to 23. First ends a of terminals 241 to 246 and 251 to 256 (FIG. 2) project through plane 20 of case 2. Second ends b of these terminals extend through case 2 to an opposite plane 26 where they are bent outward to form a part c that will be used as a wiring pattern. The outward bend of the lower parts of the terminals permits inspection of the wiring between terminals from a position opposite plane 26.

The ability for direct inspection of the wiring pattern prevents assembly errors in placing parts in a circuit. In addition, the exposure of the wiring pattern permits the use of pattern recognition devices using a TV camera for automatic parts discrimination, parts sorting guiding and for automatic assembly operations.

The placement of terminals 241 to 246 and 251 to 256 in opposite plane 26 provides stable attachment of the product in a circuit.

An LC combination part 11 includes an inductor 31 to the top of which is affixed capacitors 41 and 42. An LC combination part 12 includes an inductor 32 to the top of which is affixed a single capacitor 43. An LC combination part 13 includes an inductor 33 to the top of which are affixed capacitors 44 and 45.

Each of inductors 31 to 33 consists of a coil support 302, or reel, on which is wound a wire coil 301. Capacitors 41 to 45 are attached on the tops of respective coil supports 302.

Inductors 31 to 33 are inserted into openings 21 to 23, and joined to terminals 241 to 246 in plane 26 and to terminals 251 to 256 extending above plane 20. This arrangement provides accurate positioning of inductors 31 to 33 for high accuracy of the resulting LC filter. This accuracy of positioning is enhanced by the fixed shape of case 2.

The insertion of inductors 31 to 33 of LC combination parts 11 to 13 into openings 21 to 23 tends to retain the position and angular orientation of inductors 31 to 33 so that drift in the characteristics of the resulting LC filter in use is prevented. As a result, the LC filter has high stability.

LC combination parts 11 to 13 are made as subassemblies including their respective inductors 31 to 33 and capacitors 41 to 45, with the respective coil supports 302 wound with their wire coils 301. As a result, LC combination parts 11 to 13 can be handled as complete LC combination parts so that it is possible to assemble LC filters with any desired circuit structure by selecting the appropriate combination of parts.

Figure 3:
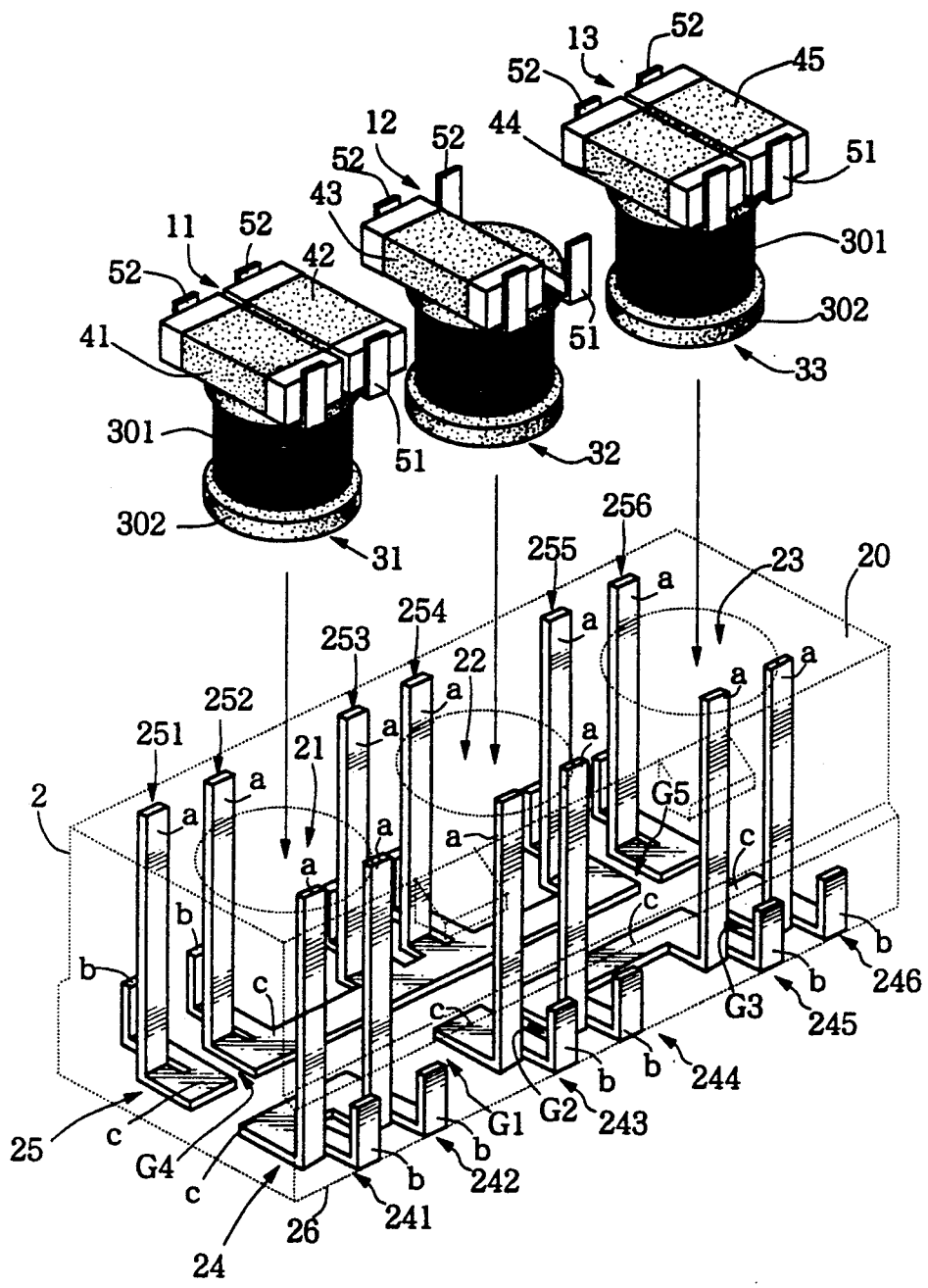
FIG. 3 is a transparent perspective view showing the structure of terminals of the invention.
Figure 4:
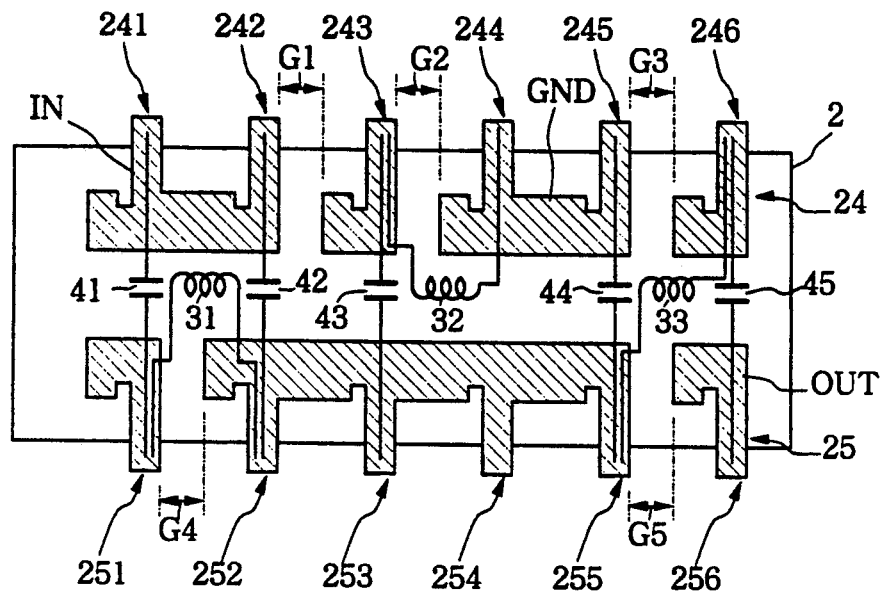
FIG. 4 is a bottom view showing a wiring pattern.

Referring now also to FIGS. 3 and 4, a wiring pattern is illustrated that is appropriate for the construction of an LC filter for a band pass filter. Terminals 241 to 246 form one terminal group 24 on one side of case 2. Terminals 251 to 256 form a second terminal group 25 on a second side of case 2. Each terminal group 24 and 25 includes six terminals spaced apart along the direction of openings 21 to 23. Terminals 241 to 246 of terminal group 24 and terminals 251 to 256 of terminal group 25 face each other at opposite sides of openings 21 to 23.

First terminal 241 of first terminal group 24 is connected to second terminal 242. Second terminal 242 is isolated from third terminal 243 by a gap G1. Third terminal 243 is isolated from fourth terminal 244 by a gap G2. Fourth terminal 244 is connected to fifth terminal 245. Fifth terminal 245 is isolated from sixth terminal 246 by a gap G3.

First terminal 251 of second terminal group 25 is isolated from second terminal 252 by a gap G4. Second terminal 252 through fifth terminal 255 are connected together. Fifth terminal 245 is isolated from sixth terminal 246 by a gap G5.

Capacitor 41 is connected between first terminal 241 of first terminal group 24 and terminal 251 of second terminal group 25. Similarly, capacitor 42 is connected between terminals 242 and 252, capacitor 43 is connected between terminals 243 and 253, capacitor 44 is connected between terminals 245 and 255, and capacitor 45 is connected between terminals 246 and 256. Inductor 31 is connected between terminals 251 and 252, inductor 32 is connected between terminals 243 and 244, and inductor 33 is connected between terminals 255 and 246.

Figure 5:
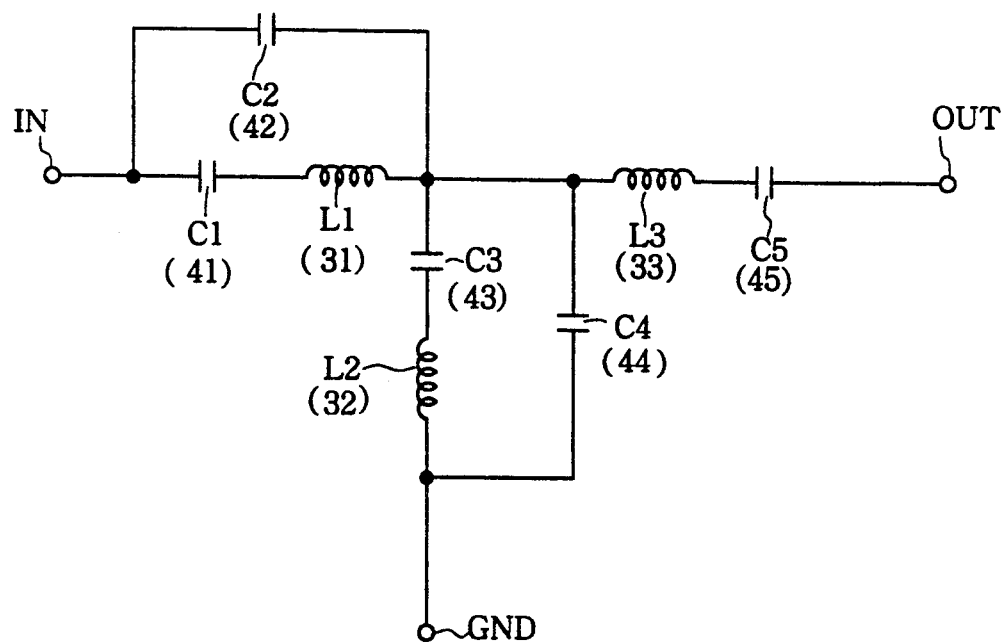
FIG. 5 is a circuit diagram of an embodiment of the LC filter of FIGS. 1 to 4.

FIG. 5 shows a circuit diagram of the LC filter constructed according to the above wiring pattern. An input terminal IN is formed by terminal 241 or 242, which are connected together. An output terminal OUT is formed by terminal 256. A ground terminal GND is formed by terminal 244 or 245, which are connected together. Capacitors 41 to 45 provide the capacitances C1 to C5 respectively, and inductors 31 to 33 provide the inductances L1 to L3 respectively.

Returning now to FIGS. 1 and 2, a case cover 6 is made of the same insulating resin as that used to make case 2. Case cover 6 is attached over plane 20 of case 2. Because they are rigidly fixed in place by their attachment to the terminals and case 2, it is unnecessary to fill an insulating resin around LC combination parts 11 to 13 inserted into openings 21 to 23. This has the benefit of avoiding changes in filter characteristics that may occur due to forces generated by shrinkage of the insulating resin.

A plurality of openings 61 are provided in case cover 6. A mating plurality of wedge-shaped bosses 27 protrude from case 2. Case cover 6 may be installed by forcing it down over case 2. Initially the sides of case cover 6 are wedged outward by bosses 27. Finally, openings 61 snap over bosses 27 to retain case cover 6 in place. Alternately, the plurality of wedge-shaped bosses can be provided on the cover and the plurality of openings can be provided on the case.

Referring to FIG. 2, LC combination parts 11 to 13 are explained in greater detail. Coil supports 302 of inductor 31 to 33 have upper and lower flanged ends 303 and 304. A coil winding portion 305 is defined between ends 303 and 304. A coil 301 is wound on coil winding portion 305 to form inductors 31 to 33 in the shape of a pole or a drum. Coil support 302 has an axial opening 306 in one or both of ends 303 and 304. Coil support 302 is preferably made of ferrite magnetic material.

Capacitors 41 to 45 have a plurality of inside electrodes 404 and 405 inside a dielectric base 401. End electrodes 402 and 403, connected to their respective electrodes, are affixed at the ends of base 401.

LC combination parts 11 to 13 have metal portions 51 and 52 to connect inductor 31 to 33 with capacitors 41 to 45. Metal portions 51 and 52 include first ends 512 and 522 affixed in opening 306 of upper end 303 using an appropriate material such as, for example, a glue 53. Second ends 511 and 521 of metal portions 51 and 52, respectively extend upward facing each across a space.

Electrodes 402 and 403 of capacitors 41 to 45 are affixed to second ends 511 and 521 of metal portions 51 and 52 by any convenient means such as, for example, by soldering. This construction permits integral attachment of capacitors 41 to 45 to inductors 31 to 33 without using a substrate. Thus, the LC combination parts of the present invention are more compact than prior art devices due to the presence of a smaller number of discrete parts.

Terminals 307 and 308 of coil 301 are connected to second ends 511 and 521 of metal portions 51 and 52 which are, in turn, attached to electrodes 402 and 403 of capacitors 41 to 45.

LC combination part 12 requires special treatment because, unlike the other LC combination parts, it has only a single capacitor 31. One of metal portions 51 and 52 each contacts an end of capacitor 43. The others of metal portions 51 and 52 does not contact a capacitor. Coil terminals 307 and 308 of inductor 32 are connected to the two metal portions 51, one of which contacts capacitor 31, and the other of which is not connected to a capacitor.

Terminals 307 and 308 of coil 301 can be soldered simultaneously with the soldering of electrodes 402 and 403 of capacitors 41 to 45 second ends 511 and 521 of metal portions 51 and 52.

Coil supports 302 of inductors 31 to 33 have opposed flanged ends 303 and 304 that form a drum shape suitable for holding coil winding portion 305 therebetween. Since capacitors 41 to 45 are attached to metal portions 51 and 52 at the end 303, it is possible to make the final assembly thinner and more compact with a total height depending principally on the length of coil support 302 in axis direction and the thickness of capacitors 41 to 45.

Ends 511 and 521 of metal portions 51 and 52 extend a distance $\Delta h$ above terminals 241 to 246 and 251 to 256. Terminals 307 and 308 of coil 301 are wound on the portion of metal portions 51 and 52 that extend above terminals 241 to 246 and 251 to 256. This prevents the wound portions of terminals 307 and 308 of coil 301 being broken by contact with terminals 241 to 246, 251 to 256 when LC combination parts 11 to 13 are inserted into openings 21 to 23.

Having described preferred embodiments of the invention with reference to the accompanying drawings, it is to be understood that the invention is not limited to precise embodiments, and that various changes and modifications may be effected therein by one skilled in the art without departing from the scope or spirit of the invention as defined in the appended claims.

What is claimed is:

1. An LC filter comprising:
   a case;
   a plurality of LC combination parts;
   said case having a plurality of holes and a plurality of terminals;
   said holes forming openings through a first plane of said case;
   said terminals corresponding to each of said holes;
   said terminals extending from a position protruding above said plane to a position adjacent an opposite plane of said case;
   said terminals each including a bend to place a portion thereof parallel to said opposite plane;
   said terminals forming a wiring pattern at said opposite plane;
   said LC combination parts including at least one inductor and at least one capacitor;
   said inductor of each of said LC combination parts being inserted through one of said holes through said first plane;
   means for electrically connecting said LC combination parts with said terminals protruding above said first plane;
   said inductor including a coil wound on a coil support; and
   said capacitors each being attached on said coil support.

2. The LC filter recited in claim 1 wherein:
   said plurality of holes includes three holes spaced apart along a direction;
   said terminals including first and second terminal groups;
   said first terminal group including six terminals aligned with each other in said direction;
   said second terminal group including six terminals aligned with each other in said direction;
   said six terminals of said first terminal group facing said six terminals of said second terminal group on opposite sides of said three holes;
   said first terminal group having a first terminal connected to a second terminal by said wiring pattern;
   said first terminal group having a third terminal separated from said second terminal by a gap in said wiring pattern;
   said first terminal group having a fourth terminal separated from said third terminal by a gap on said wiring pattern;
   said first terminal group having a fifth terminal connected to said fourth terminal by said wiring pattern;
   said first terminal group having a sixth terminal separated from said fifth terminal by a gap in said wiring pattern;
   said second terminal group having a first and a second terminal separated by a gap on said wiring pattern;

said second terminal group having second, third, fourth and fifth terminals all connected together by said wiring pattern;

said second terminal group a sixth terminal separated from said fifth terminal by a gap;

a first of said LC combination parts in said first hole including first and second capacitors and a first inductor;

said first capacitor being connected between said first terminal of said first terminal group and said first terminal of said second terminal group;

said first inductor being connected between said first and said second terminal of said second terminal group;

a second of said LC combination parts in said second hole including a third capacitor and a second inductor;

said third capacitor being connected between said third terminal of said first terminal group and said third terminal of said second terminal group;

said second inductor being connected between said third and said fourth terminals of the first terminal group;

a third of said LC combination parts in said third hole including a fourth capacitor, a fifth capacitor and a third inductor;

said fourth capacitors being connected between said fifth terminal of said first terminal group and said fifth terminal of said second terminal group;

said fifth capacitor being connected between said sixth terminal of said first terminal group and said sixth terminal of said second terminal group; and said third inductor being connected between said sixth terminal of said first terminal group and said fifth terminal of said second terminal group.

3. The LC filter recited in claim 1 further comprising:
said coil support having a coil winding portion in a middle between first and second ends; and
said at least one capacitor being fixed to said first end of said coil support.

4. The LC filter recited in claim 1 wherein:
said plurality of LC combination parts include means for physically connecting said inductor to said capacitor;
said means for connecting including at least first and second metal portions;
said first and second metal portions each being fixed at one end thereof to an end of said coil support;
said first and second metal portions including second ends facing each other across a space; and
said at least one capacitor being affixed between said first and second metal portions.

5. The LC filter recited in claim 4, wherein:
said terminals including first and second terminal groups;
said first and second metal portions and ones of said terminals of first and second terminal groups face each other;
said first and second metal portions including first and second protruding portions, respectively, extending a distance above respective terminals of said first and second terminal groups;
a first terminal of said coil being connected to said first protruding portion; and
a second terminal of said coil being connected to said second protruding portion.

6. An LC filter comprising:
a case;
at least one opening in said case;
a first terminal group having at least first and second terminals in a line in said case on a first side of said least one opening;
a second terminal group having at least third and fourth terminals in a line in said case on a second side of said at least one opening;
wiring interconnecting selected ones of said at least first and second terminals, and wiring interconnecting selected ones of said at least third and fourth terminals;
an inductor;
said inductor including a coil wound on a coil support;
said coil support having first and second ends;
at least first and second metal contacts affixed in said first end and extending upward therefrom;
at least one capacitor;
means for affixing said at least one capacitor to said at least first and second metal contacts, whereby said inductor and said at least one capacitor become an integral unit forming an LC combination unit;
said at least one inductor being fitted into said at least one hole;
means for electrically connecting said LC combination and said first terminal group and said second terminal group; and
means for securing said LC combination unit in said case.

7. Apparatus according to claim 6, wherein said means for securing includes:
first securing means on said case;
a cover;
second securing means on said cover; and
said first securing means engaging said second securing means when said cover is placed over said case, thereby securing said LC combination unit in said case.

8. Apparatus according to claim 7, wherein:
said first securing means includes one of a wedge-shaped boss and an opening;
said second securing means includes the other of a wedge-shaped boss and an opening; and
said wedge-shaped boss spreading fitting into said opening when said cover is fitted onto case, whereby said cover secures said LC combination unit in place in said case.

* * * * *